(12) United States Patent
Mio et al.

(10) Patent No.: US 7,999,362 B2
(45) Date of Patent: Aug. 16, 2011

(54) METHOD AND APPARATUS FOR MAKING SEMICONDUCTOR DEVICES INCLUDING A FOIL

(75) Inventors: Hannes Mio, Taufkirchen (DE); Horst Groeninger, Maxhuette (DE); Hermann Vilsmeier, Karlsfeld (DE)

(73) Assignee: Infineon Technologies AG, Neubiberg (DE)

( * ) Notice: Subject to any disclaimer, the term of this patent is extended or adjusted under 35 U.S.C. 154(b) by 678 days.

(21) Appl. No.: 12/020,151

(22) Filed: Jan. 25, 2008

(65) Prior Publication Data

US 2009/0189265 A1  Jul. 30, 2009

(51) Int. Cl.
*H01L 23/552* (2006.01)
(52) U.S. Cl. ........ 257/660; 257/643; 257/659; 257/753; 257/E21.007; 257/E21.134; 257/E21.483; 257/E21.499; 257/E21.517

(58) Field of Classification Search .................. 257/620, 257/676, 753, 643, 646, 658, 659, 660, E21.007, 257/134, 347, 483, 499, 517
See application file for complete search history.

(56) References Cited

U.S. PATENT DOCUMENTS

| | | | |
|---|---|---|---|
| 4,959,118 A | 9/1990 | Herbin et al. |
| 4,985,105 A | 1/1991 | Masuda |
| 5,034,591 A | 7/1991 | Fang |
| 5,635,009 A | 6/1997 | Kawamura et al. |
| 7,087,133 B2 | 8/2006 | Chapman |
| 2007/0216000 A1 | 9/2007 | Sasamura et al. |

*Primary Examiner* — David Nhu
(74) *Attorney, Agent, or Firm* — Dicke, Billig & Czaja, PLLC

(57) ABSTRACT

A method for manufacturing a semiconductor device including covering a portion of at least one semiconductor device with a foil, including covering at least one target region of the semiconductor device, and illuminating the foil with a laser to singulate from the foil a portion covering the at least one target region of the at least one semiconductor device.

12 Claims, 8 Drawing Sheets

METHOD AND APPARATUS FOR MAKING SEMICONDUCTOR DEVICES INCLUDING A FOIL

BACKGROUND

Adhesive tape or foil is often applied to cover sensitive regions of various types of semiconductor devices (e.g. semiconductor sensors) in order to protect the sensitive regions of such devices from damage at various stages of manufacture and assembly such as during testing, delivery to a customer, and soldering of the semiconductor device to a circuit board by the customer. For example, an adhesive foil is often applied to cover apertures in housings of optical sensing devices to protect the optical or active regions (e.g. photodiode or charge-coupled device arrays) of the semiconductor optical sensor chip disposed therein, or to cover apertures in the housings of pressure-sensing MEMs devices. The adhesive foil applied to optical sensing devices is typically thin enough and transparent enough to allow testing of the active regions of the optical sensor chip by an external light source with the protective foil in place.

According to conventional techniques, application of adhesive foil to such devices typically includes stamping or punching pieces having a desired shape from a continuous reel of adhesive foil using a cutting die or punch knife, and then attaching the stamped piece of adhesive foil at a desired location on the device. While such conventional techniques are generally effective, there are several drawbacks.

For example, glue or adhesive material from the adhesive foil tends to accumulate on the punch tools so that frequent cleaning is required and the punch knives become dull and require periodic replacement. Such cleaning and replacement is costly in terms of parts and labor, as well as in costs associated with downtime of the equipment. Also, such techniques are slow in that the stamping and application of the stamped piece of adhesive foil to the semiconductor device are sequential in nature, and because the application equipment must align itself with each individual semiconductor device in order to apply the piece of adhesive foil.

Additionally, stamping or punching processes often leave glue residue along the edges of the stamped piece of adhesive foil. During subsequent testing of the semiconductor device, test equipment moving in close proximity to device may contact the glue residue and peel off the piece of foil thereby exposing the device to potential contamination and potentially jamming the test equipment. Furthermore, stamping or punching processes are generally limited to circular shapes as corners of non-circular shapes are not always properly or completely punched which reduces the quality of the stamped shapes so that they may not properly adhere to the device or have excess glue residue as described above.

SUMMARY

In one embodiment, a method is provided for manufacturing a semiconductor device. The method includes covering a portion of at least one semiconductor device with a foil, including covering at least one target region of the semiconductor device, and illuminating the foil with a laser to singulate from the foil a portion covering the at least one target region of the at least one semiconductor device.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments of a method and apparatus for attaching an adhesive tape or foil to a semiconductor device are described herein which include employing a laser to singulate a portion of the adhesive foil covering at least one selected site on the semiconductor device after the adhesive foil has been applied to the semiconductor device.

Figure 1:
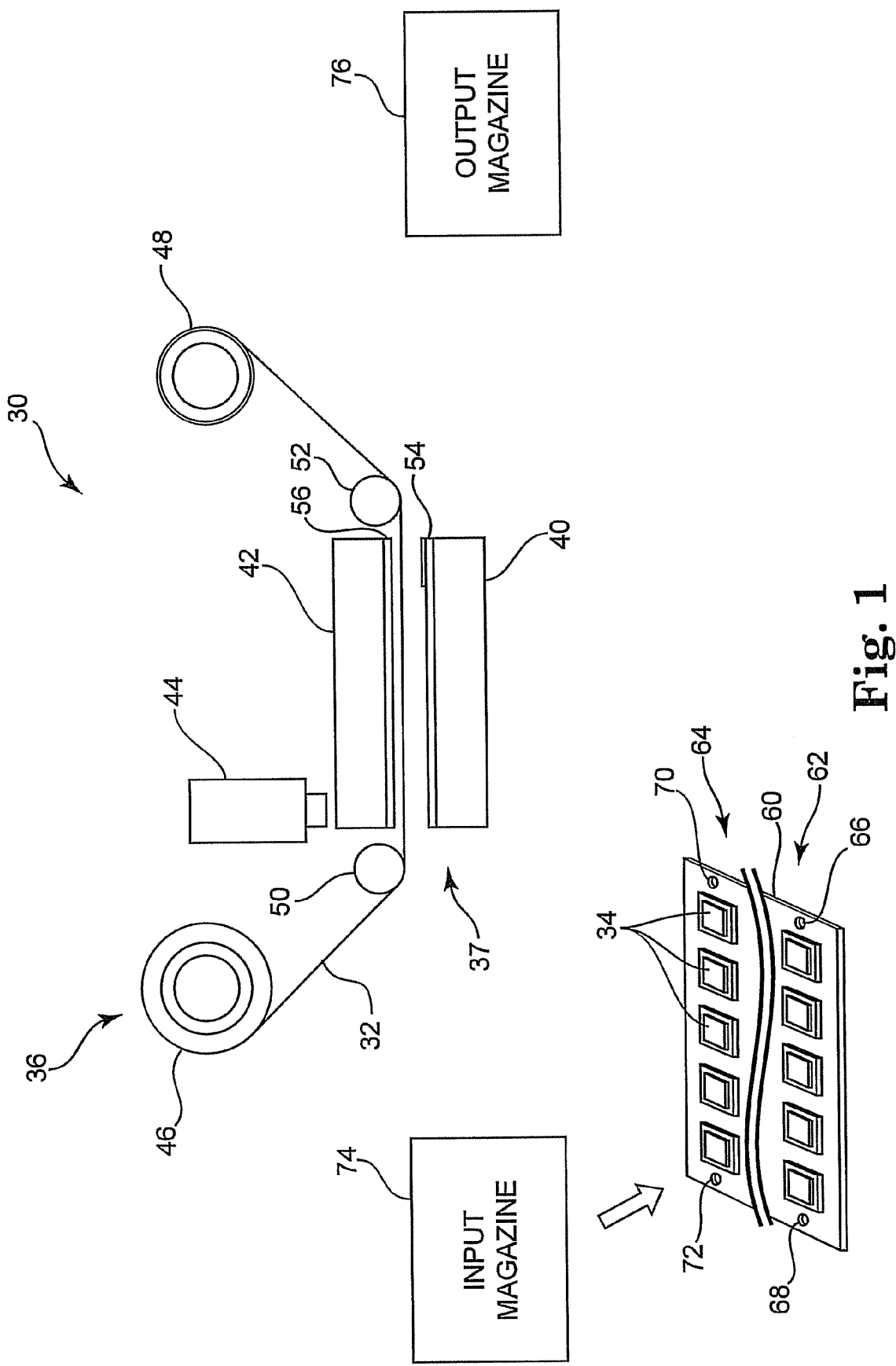
FIG. 1 illustrates an apparatus for attaching a foil to a semiconductor device according to one embodiment.

FIG. 1 illustrates an one embodiment of an apparatus 30 for attaching an adhesive tape or foil 32 to a semiconductor device, such as semiconductor device 34. Apparatus 30 includes a transport table 40, a pressure plate 42, a laser 44, a supply reel 46, a take-up reel 48, and a pair of rollers 50 and 52. Together, supply reel 46, take-up reel 48, and rollers 50 and 52 form a supply assembly 36, with and transport table 40 and pressure plate 42 forming an applicator assembly 37.

According to one embodiment, supply assembly 36 provides portions of adhesive foil 32 to applicator assembly by incrementally transferring a continuous length of adhesive foil 32 from supply reel 46 to take-up reel 48 via applicator assembly 37. Rollers 50 and 52 maintain tension on adhesive foil 32 and are positioned so as to maintain a segment of adhesive foil 32 in a substantially planar position therebetween (e.g. in a horizontal plane). In one embodiment, adhesive foil 32 comprises a polymeric material. In one embodiment, adhesive foil 32 comprises a Kapton® material.

In one embodiment, transport table 40 and pressure plate 42 are positioned between rollers 50 and 52 and on opposite sides of adhesive foil 32, with transport table 40 being positioned on the adhesive side of adhesive foil 32. According to one embodiment, transport table 40 and pressure plate 42 respectively include layers 54 and 56 of an elastic material on the surfaces proximate to adhesive foil 32.

According to one embodiment, as illustrated by FIG. 1, a plurality of semiconductor devices 34 to which adhesive foil 32 is to be attached by apparatus 30 are mounted or positioned in a pre-determined arrangement on a support sheet or strip 60. In one embodiment, the plurality of semiconductor devices 34 are positioned on strip 60 in a grid or matrix-like fashion having a plurality of parallel rows, as illustrated by a first row 62 and a last row 64, and spaced at a pre-defined pitch. In one embodiment, for example, semiconductor devices 34 are arranged in a matrix having 20 rows with five semiconductor devices 34 per row, for a total of 100 semiconductor devices per strip 60. In one embodiment, strip 60 includes a plurality of alignment features, such as a pair of alignment features positioned at opposite ends of each row, as illustrated by alignment features 66 and 68 at opposite ends of first row 62 and alignment features 70 and 72 at opposite ends of last row 64, with the plurality of semiconductor devices 34 being positioned in a grid-like fashion at a predetermined pitch relative to such alignment features.

In one embodiment, apparatus 30 includes an input magazine 74 containing a plurality of strips 60, each strip having mounted thereto a plurality of semiconductor devices 34. Similarly, in one embodiment, apparatus 30 includes an output magazine 76 configured to receive strips 60 after adhesive foil has been attached to desired portions of the semiconductor devices 34 mounted thereto, which will be described in greater detail below.

Figure 2:
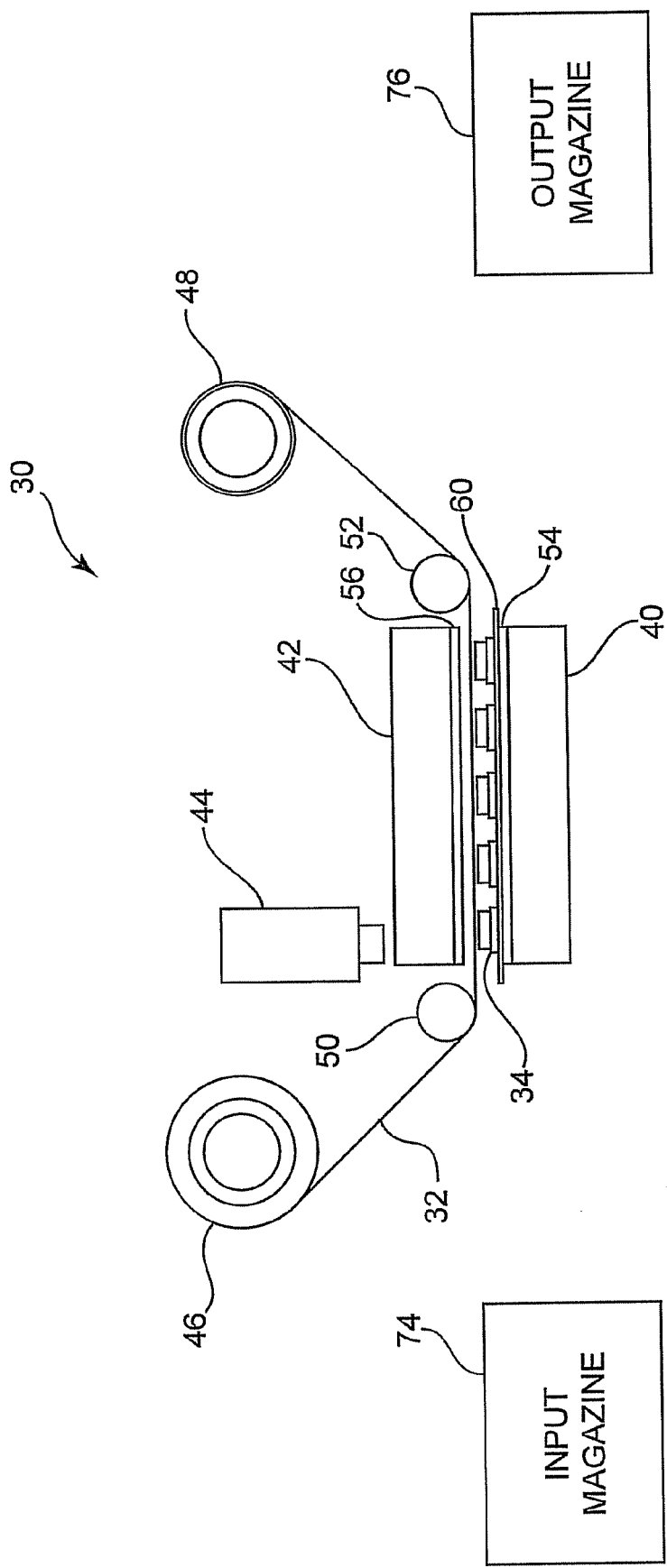
FIG. 2 illustrates an example of the operation of the apparatus of FIG. 1.

FIGS. 2 through 6 below describe an illustrative example of the operation of apparatus 30 of FIG. 1 for attaching adhesive foil to semiconductor devices 34. With reference to FIG. 2, transport table 40 receives strip 60 from input magazine 74 and positions strip 60 at a desired position relative to adhesive foil 32, pressure plate 42, such as by using alignment features 68, 70, 72, and 74 of strip 60. In one embodiment, transport table 40 initially positions strip 60 so that first row 62 of semiconductor devices 34 is aligned with and positioned at a predetermined position relative to adhesive foil 32 and pressure plate 44

Figure 3:
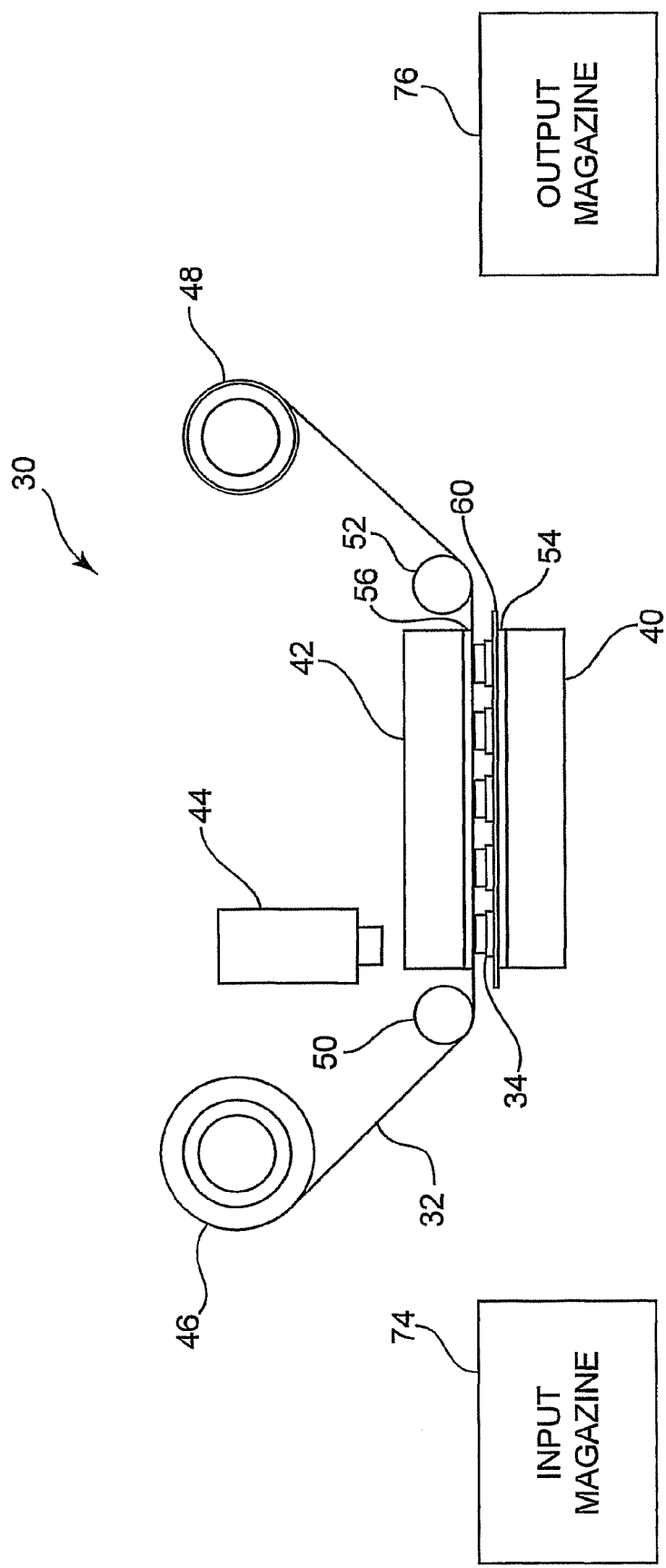
FIG. 3 illustrates an example of the operation of the apparatus of FIG. 1.

Referring to FIG. 3, transport table 40 subsequently moves upward until a surface of semiconductor devices 34 contacts the adhesive side of adhesive foil 32. Pressure plate 42 then moves down and presses adhesive foil 32 against the surface or body of semiconductor devices 34 of first row 62 so that adhesive foil 32 adheres thereto. Initially, it is assumed that an un-used length of adhesive foil 32 is positioned between rollers 50 and 52. Elastic layers 54 and 56 enable transport table 40 and pressure plate 42 to evenly press elastic foil 32 against the surfaces of semiconductor devices 34 and without causing damage thereto.

In one embodiment, adhesive foil 32 has a width such that it is applied to only one row of semiconductor devices 34 at a time. In one embodiment, adhesive foil 32 has a width which covers at least a portion of a surface of the semiconductor devices 34 of row first row 62, including covering at least one target region of each semiconductor device 32.

Figure 4:
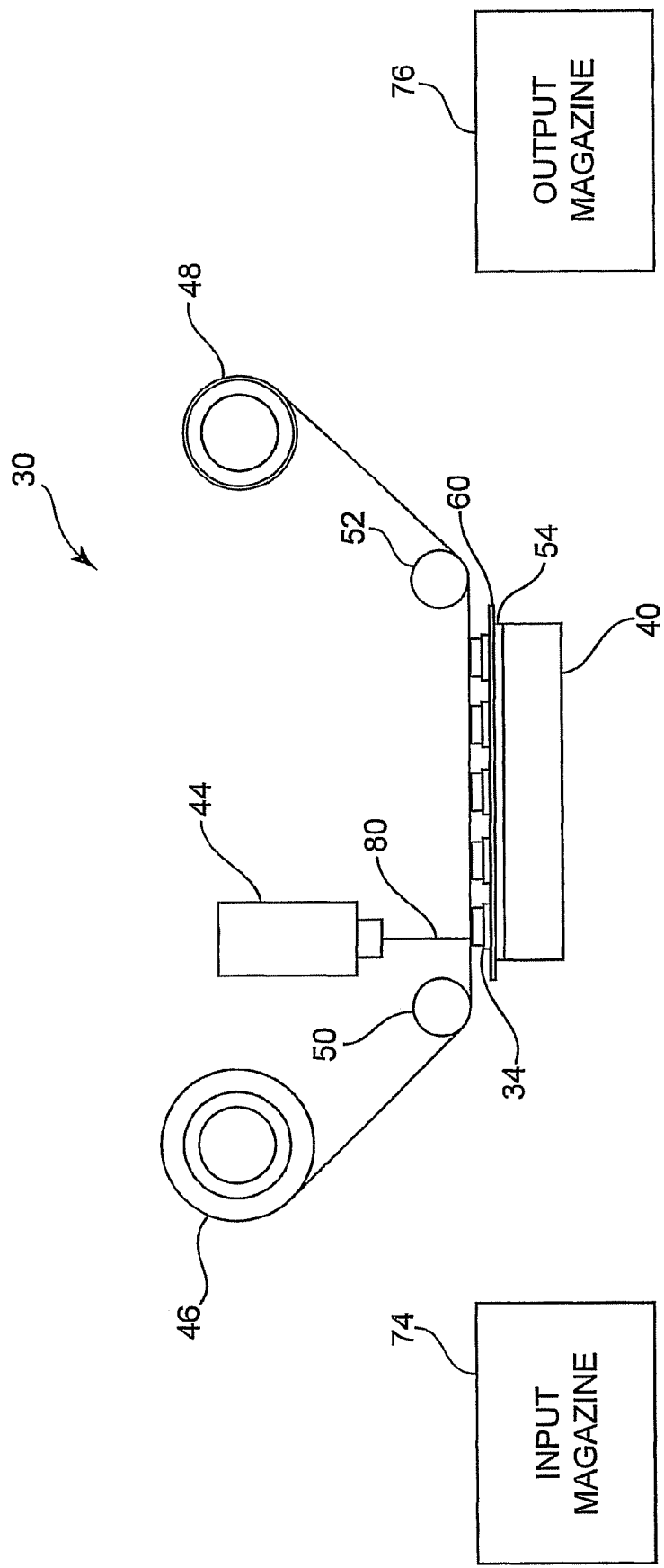
FIG. 4 illustrates an example of the operation of the apparatus of FIG. 1.

With reference to FIG. 4, in one embodiment, after pressing and adhering adhesive foil 32 to semiconductor devices 34, pressure plate 42 moves to a retracted position (not shown). Laser 44 then cuts or singulates from the continuous length of adhesive foil 32 a piece of foil covering the target region of each of the semiconductor devices 34 of first row 62 of strip 60 with a laser beam 80. In one embodiment, laser beam 80 cuts through adhesive foil 32 along a line that forms a closed loop about the at least one target region. Laser 44 is able to cut any desired shape, circular or non-circular, from adhesive foil 32 to cover any portion of any particular semiconductor device 34 required to be protected by adhesive foil 32. For example, in one embodiment, as described by FIGS. 7A through 7C below, laser 44 cuts or singulates circular shapes from the continuous length of adhesive foil 32.

In one embodiment, laser 44 initially aligns with a first semiconductor device 34 of row 62 and thereafter moves from one semiconductor device 34 to another in first row 62 based on the predetermined pitch of the grid of semiconductor devices 34 mounted to strip 60 without needing to re-align with each individual semiconductor device 34.

After cutting the continuous length of adhesive foil 32 as required for each semiconductor device 34 of first row 62, transport table 40 moves downward and pulls away from continuous length of adhesive foil 32 leaving the singulated pieces attached to semiconductor devices 34 and covering the at least one target region thereof. Supply assembly 36 subsequently drives supply and take-up reels 46 and 48 to advance the continuous length of adhesive foil 32 so as to position un-used portions of adhesive foil 32 over the next semiconductor devices 34 to which adhesive foil 32 is to be applied (e.g. semiconductor devices 36 of a next row or strip 60), with take-up reel 48 collecting the used or cut portion of adhesive foil 32. Transport table 40 then repositions strip 60 so that a next row of semiconductor devices 34 is aligned with and positioned at the predetermined position relative to adhesive foil 32 and pressure plate 44, similar to that described above by FIG. 2. The pressing of adhesive foil 32 onto semiconductor devices 30 and laser cutting processes described above by FIGS. 3 and 4 are then repeated for the next row.

Figure 5:
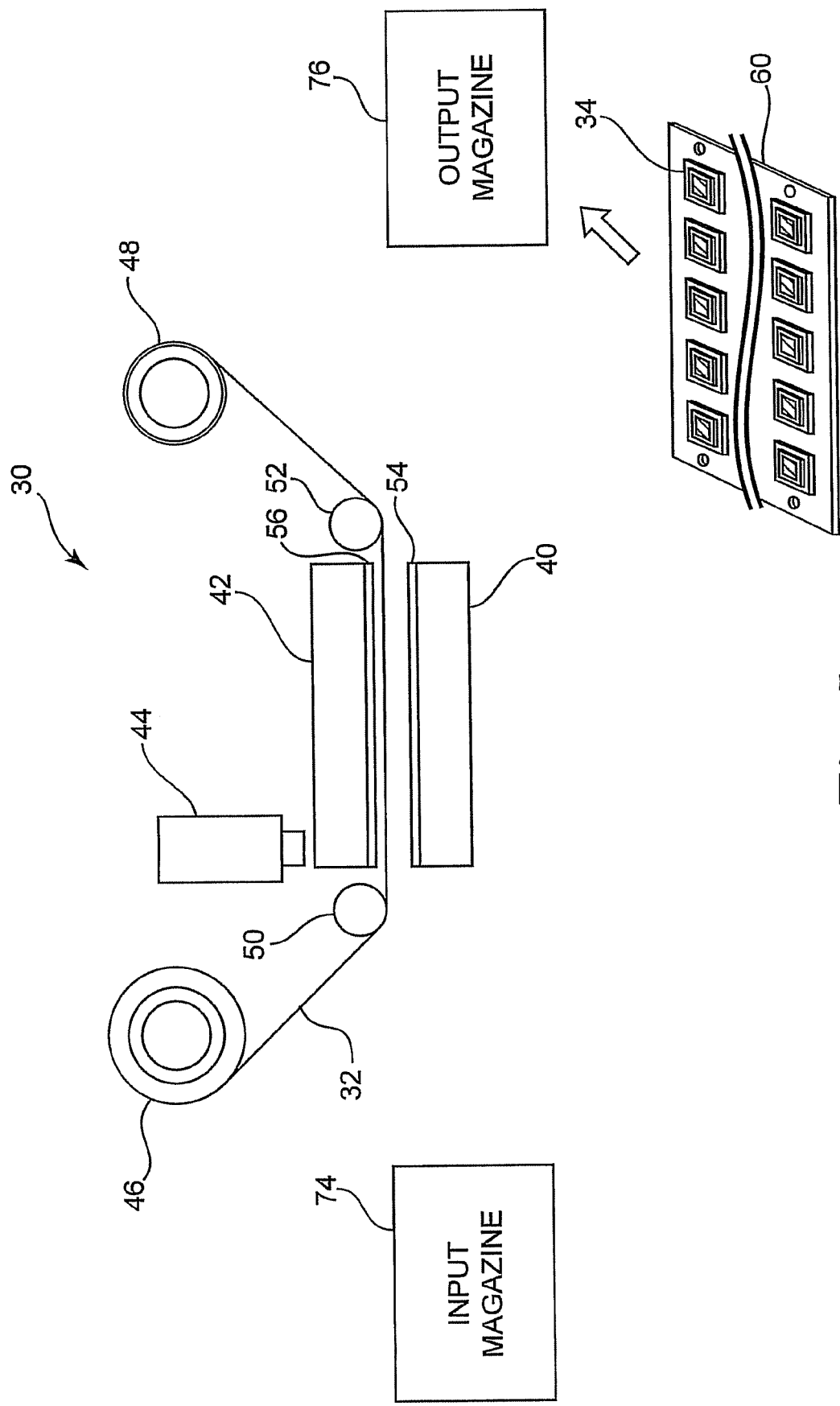
FIG. 5 illustrates an example of the operation of the apparatus of FIG. 1.

The above described processes of FIGS. 2 through 4 are repeated for each row of semiconductor devices 34 of strip 60 until pieces of adhesive foil have been singulated from the continuous length of adhesive foil 32 and cover the at least one target region of each semiconductor device 34 of strip 60. As illustrated by FIG. 5, transport table 40 subsequently loads the completed strip 60 into output magazine 76 and receives a next strip 60 from input magazine 74 and repeats the processes as described by FIGS. 1 through 4 for the next strip 60.

Figure 6:
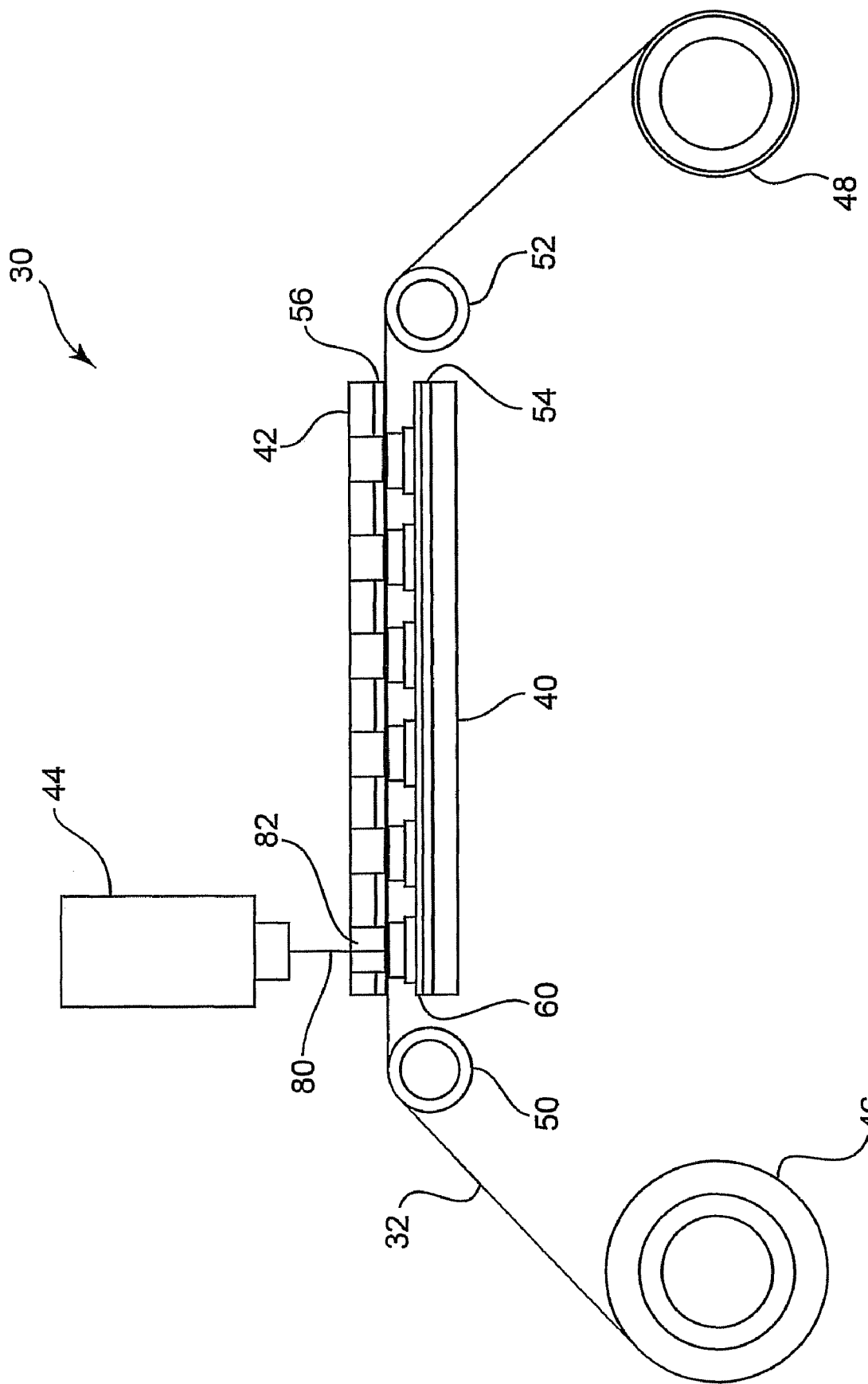
FIG. 6 illustrates an apparatus for attaching a foil to a semiconductor device according to one embodiment.

FIG. 6 illustrates an alternate embodiment of apparatus 30, where pressure plate 42 includes apertures 82 spaced according to the pitch at which semiconductor devices 34 are mounted to strip 60. With reference to FIG. 4, in lieu of moving pressure plate 42 to a retracted position, pressure plate 42 remains in contact with adhesive foil 32 and laser 44 directs beam 80 through apertures 82 to cut or singulate the desired shapes from adhesive foil 32. Pressure plate 42 is subsequently moved upward to enable transport table 40 to reposition strip 60 to a next row or to move a completed strip 60 to output magazine 76.

Although described above as moving transport table 40 to reposition a next row of semiconductor devices 34 for application of adhesive foil 32, it is noted that such movement is relative such that adhesive foil 32 and pressure plate 42 could be moved in lieu of transport table 40 to achieve similar results. Similarly, movement of laser 44 is relative to adhesive tape 32, transport table 40, pressure plate 42, and strip 60.

In the above described embodiments, semiconductor devices 34 may be any semiconductor device having at least one target region that is desired or required to be covered with a protective foil. For example, as described above, semiconductor sensors, such as optical sensors, pressure sensors, particle sensors, accelerometers, etc., often have sensitive regions which are desired to be protected during shipping, testing, and soldering of the device to another component, such as a printed circuit board.

Figure 7A:
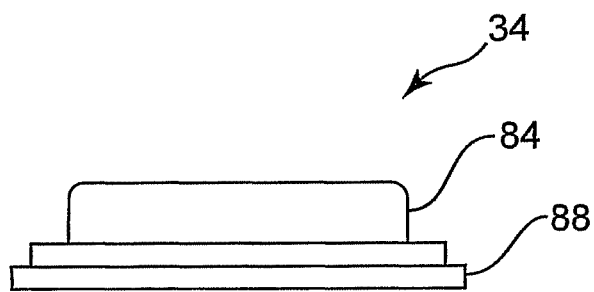
FIG. 7A is a side view of an example semiconductor device.
Figure 7B:
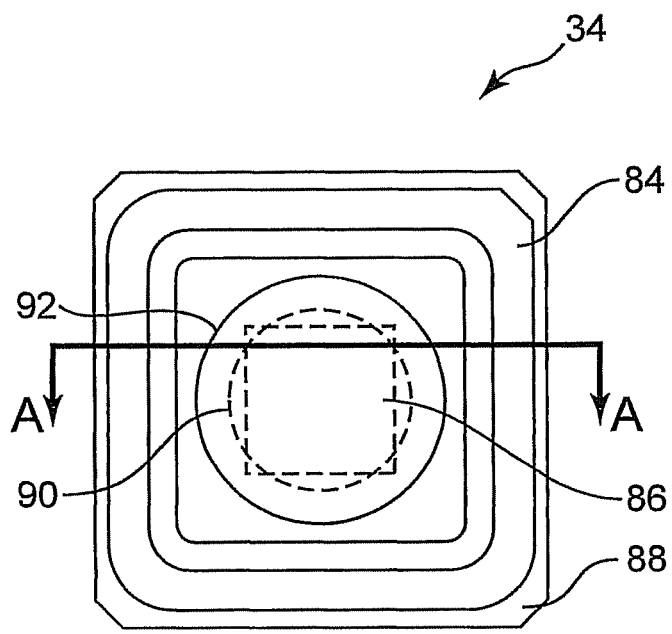
FIG. 7B is a top view of the example semiconductor device of FIG. 7A.
Figure 7C:
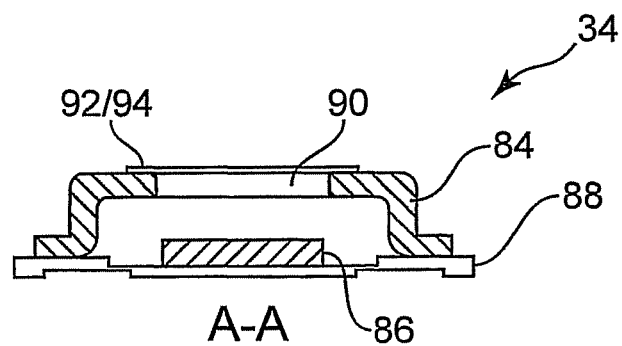
FIG. 7C is sectional view of the example semiconductor device of FIGS. 7A and 7B.

As such, in one embodiment, semiconductor devices 34 comprise a semiconductor optical sensing device, such as respectively illustrated by the side, top, and sectional views of FIGS. 7A through 7C. Semiconductor optical sensing device 34 includes a casing or housing 84 covering an optical sensing chip 86 mounted on a leadframe 88. In one embodiment, housing 84 comprises a plastic material. Plastic housing 84 includes a circular opening 90 which allows incident light to enter housing 84 and reach active areas (i.e. light detecting regions) of sensing optical sensing chip 86 and which is desired to be covered by adhesive foil 32.

In one embodiment, according to the above described processes, laser beam 44 cuts or singulates a circular piece of adhesive foil 92 from the continuous length of adhesive foil 32 about a perimeter of circular opening 90. In one embodiment, laser beam 44 cuts a square piece of adhesive foil 94 from the continuous length of adhesive foil 32. In one embodiment, adhesive foil 32 comprises a Kapton® foil which is substantially transparent so as to enable subsequent optical testing to be performed with the circular piece of adhesive foil 92 in place over circular opening 90. In one embodiment, the Kapton® foil has a thickness of 200 μm.

In one embodiment, laser beam 44 generates laser beam 80 having a power and a wavelength sufficient to cut through adhesive foil 32, but without causing damage to the underlying surface or housing of semiconductor device 34, such as plastic housing 84, to which adhesive foil 32 is attached. In one embodiment, laser 44 is configured to cut through foil having a thickness of up to 1 millimeter. In one embodiment, laser 44 comprises a low power laser. In one embodiment, laser 44 comprises a 3-watt laser. In one embodiment, laser 44 has a power in a range from 3 watts to 10 watts. In one embodiment, laser 44 generates a green laser beam 80 having a wavelength of 532 nanometers. In one embodiment, the wavelength of laser beam 80 is dependent upon the material of adhesive foil 32 and a material of the surface or housing of semiconductor device 34 to which the adhesive foil is attached.

Figure 8:
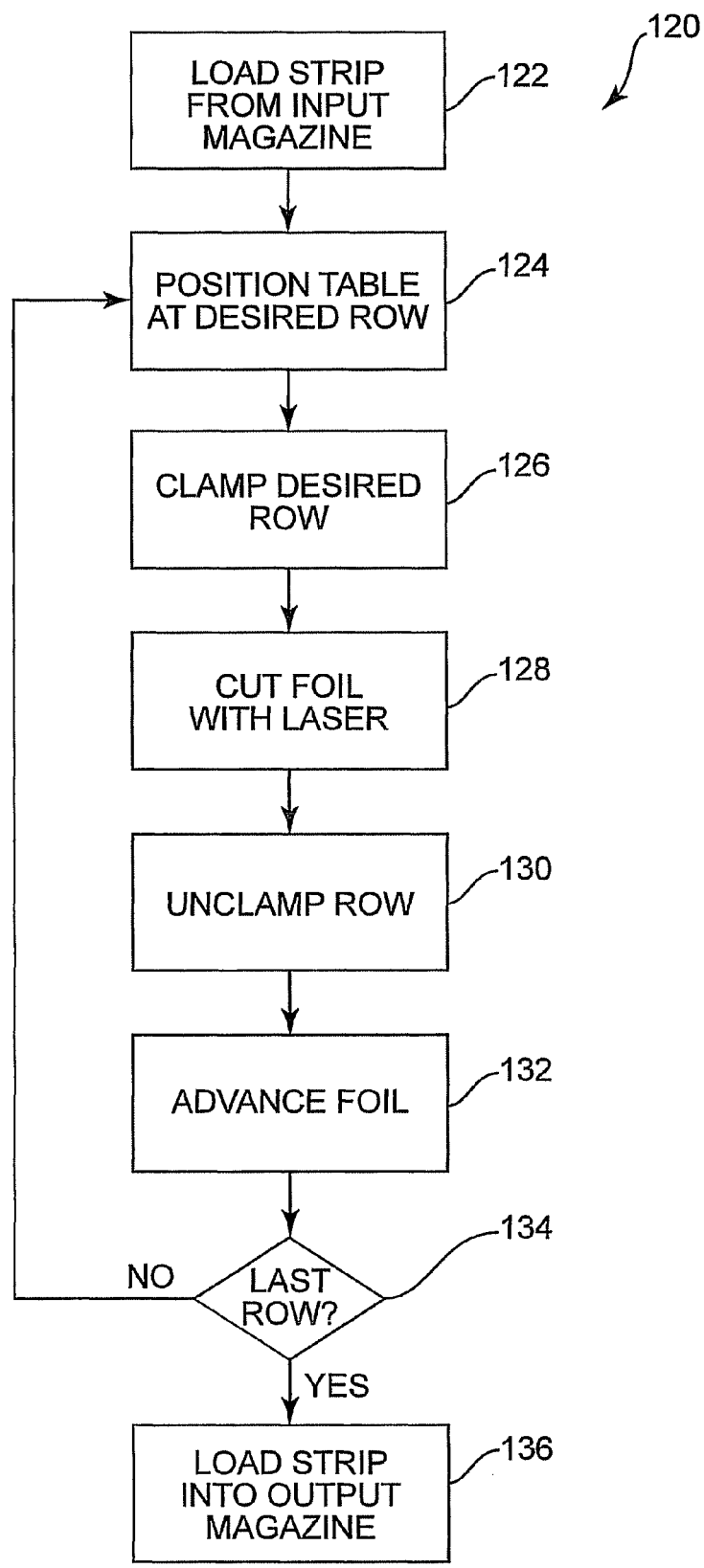
FIG. 8 is a flow diagram illustrating a process of attaching foil to a semiconductor device according to one embodiment.

FIG. 8 is a flow diagram illustrating one embodiment of a process 120 for attaching adhesive foil to a semiconductor device, such as illustrated above by FIGS. 1 through 7. Process 120 begins at 122 with the receiving of at least one semiconductor device. In one embodiment, a strip having a plurality of semiconductor devices mounted thereto in a matrix or grid-like fashion having a plurality of rows and spaced at a predetermined pitch, such as illustrated and described by strip 60 of FIG. 1, is loaded from an input magazine onto a transport table, such from input magazine 74 to transport table 40.

At 124, transport table 40 positions strip 60 at a desired position, such that the first row of semiconductor devices 34 mounted thereon is at a predetermined position below a portion of a continuous length of adhesive foil and a press plate, such as adhesive tape 32 and press plate 42. At 126, press plate 42 presses or clamps an adhesive side of adhesive foil 32 against the semiconductor devices 34 of the first row of strip 60 such that adhesive foil 32 covers at least a portion of a surface of the semiconductor devices 34, including covering at least one target region. In one embodiment, transport table 40 moves into a position so that the surfaces of semiconductors devices contact the adhesive side of adhesive foil 32 followed by press plate 42 moving into contact with and pressing adhesive foil 32 against semiconductor devices 34.

At 128, a laser, such as laser 44, singulates from the continuous length of adhesive foil 32 a piece of adhesive foil covering the at least one target region of each semiconductor device 34 of the row. In one embodiment, press plate 42 is moved to a retracted position prior to laser 44 singulating pieces from the continuous length of adhesive foil 32, such as illustrated by FIG. 4. In one embodiment, press plate 42 remains in a "clamped" position and presses adhesive foil 32 against semiconductor devices 34 as laser 44 singulates adhesive foil through apertures in press plate 42 which are aligned with the grid of semiconductor devices 34.

After singulating the pieces of foil from the continuous length of adhesive foil 32 for each semiconductor 34 of the row, transport table 40 and press plate 42 release strip 60 from adhesive foil. In one embodiment, press plate 42 disengages from the row of semiconductor devices 34 and transport table 40 moves away from adhesive foil 32 causing semiconductor devices 34 to pull away and release from the continuous length of adhesive foil 32 and leaving the singulated pieces of adhesive foil adhered to and covering the target regions on each of the semiconductor devices 34. At 132, process 120 advances the continuous length of adhesive foil 32 so that unused portions of adhesive foil are positioned over semiconductor devices 34 of a next row.

At 134, process 120 queries whether the row of semiconductor devices 34 to which adhesive foil 32 was just applied is the last row of semiconductor devices of strip 60. If the answer to the query at 134 is "no", process 120 repeats the processes of 124 through 132 for a next row of semiconductor devices 34 of strip 60. If the answer to the query at 134 is "yes", process 120 is complete strip 60 and the completed strip 60 is loaded into an output magazine, such as output magazine 76. Process 120 is then repeated for each subsequent strip 60 received from input magazine 74.

In summary, by employing laser 44 to cut adhesive foil 32 according to embodiments of the apparatus 30 and techniques described herein, apparatus 30 eliminates the frequent cleaning of glue residue and periodic replacement of punch knives associated with conventional punching or stamping techniques, thereby reducing maintenance costs and downtime of production equipment while outputting at least as many units per hour as conventional techniques.

Also, by simultaneously applying the adhesive foil to multiple semiconductor devices and then segmenting the attached foil at target areas on each semiconductor device, the methods and apparatus according to embodiments herein performs the attaching and singulating in a more efficient parallel fashion as compared to the sequential fashion of punching the foil and attaching the punches shapes to each semiconductor device. Additional efficiencies are gained by arranging the incoming semiconductor devices in a matrix at a predetermined pitch so that the laser is not required to align with each semiconductor device as compared to the conventional techniques where aligned is required with each semiconductor device to attach the punched piece of foil.

Furthermore, singulating the adhesive foil 32 with laser 44 braises the edges of the singulated pieces of foil adhered to and covering the target regions of semiconductor devices 34 which makes the edges smoother and eliminates the occurrence of unwanted glue residue as compared to conventional punching or stamping techniques. As a result, laser singulated pieces of foil are less likely to be pulled off during subsequent processes, such as by test equipment.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An apparatus for attaching a foil to a semiconductor device comprising:
    an applicator configured to cover a portion of at least one semiconductor device, including at least one target region of the at least one semiconductor device, with a portion of a foil; and
    a laser configured to cut from the portion of the foil a piece of foil covering the at least one target area of the at least one semiconductor device with a laser beam.

2. The apparatus for attaching a foil to a semiconductor device of claim 1, wherein the laser is configured to cut through the foil along a line that forms a closed loop about the at least one target area.

3. The apparatus for attaching a foil to a semiconductor device of claim 1, wherein the closed loop is circular in shape.

4. The apparatus for attaching a foil to a semiconductor device of claim 1, wherein the laser is configured to cut through the foil without damaging the semiconductor device.

5. The apparatus for attaching a foil to a semiconductor device of claim 1, wherein the laser has a power within a range from 3 to 10 watts.

6. The apparatus for attaching a foil to a semiconductor device of claim 1, wherein the laser beam has a wavelength of 532 nanometers.

7. An apparatus for applying a foil to semiconductor devices, the apparatus comprising:
    a supply assembly configured to provide portions of a continuous length of foil;
    an applicator assembly configured to receive a portion of foil from the supply assembly and to apply the portion of foil to cover at least a portion of each surface of a plurality of semiconductor devices, including covering at least one target region on the surface of each semiconductor device; and
    a laser, wherein for each semiconductor device, the laser is configured to cut from the portion of foil a piece of foil covering the at least one target region.

8. The apparatus for applying a foil to semiconductor devices of claim 7, wherein the applicator assembly includes:
    a transport table configured to position the plurality of semiconductor devices so that the surfaces of the plurality of semiconductor devices contact an adhesive side of the portion of foil; and
    a pressure plate configured to engage and press the portion of foil against the surfaces of the plurality of semiconductor devices.

9. The apparatus for applying a foil to semiconductor devices of claim 8, wherein the pressure plate includes a plurality of apertures, one positioned above each of the plurality of semiconductor devices and through which the laser cuts the portion of foil.

10. The apparatus for applying a foil to semiconductor devices of claim 7, wherein after the laser cuts the pieces of foil covering the at least one target region of each semiconductor device, the applicator assembly is configured to move the plurality of semiconductor devices away from the portion of foil so that the portion of foil releases from the surface of each semiconductor device leaving the piece of foil adhered to and covering the at least one target region.

11. The apparatus for applying a foil to semiconductor devices of claim 7, wherein the plurality of semiconductor devices comprises a row of semiconductor devices from a group of semiconductor devices arranged in a grid having a predetermined spacing.

12. A semiconductor device comprising:
    a housing; and
    a piece of foil having a braised perimeter edge covering a portion of the housing, wherein the housing comprises a polymer material, and wherein the piece of foil is an adhesive foil adhered to the polymer material.

* * * * *